(12) United States Patent
Moffitt

(10) Patent No.: US 9,183,342 B2
(45) Date of Patent: *Nov. 10, 2015

(54) MULTI-DIMENSIONAL PHYSICAL ARRANGEMENT TECHNIQUES USING BIN-PACKING WITH PER-BRANCH COMBINATION TRIES

(71) Applicant: INTERNATIONAL BUSINESS MACHINES CORPORATION, Armonk, NY (US)

(72) Inventor: Michael David Moffitt, Austin, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 82 days.

This patent is subject to a terminal disclaimer.

(21) Appl. No.: 14/300,688

(22) Filed: Jun. 10, 2014

(65) Prior Publication Data

US 2015/0161317 A1 Jun. 11, 2015

Related U.S. Application Data

(63) Continuation of application No. 14/099,021, filed on Dec. 6, 2013.

(51) Int. Cl.
G06F 17/50 (2006.01)
(52) U.S. Cl.
CPC ................... *G06F 17/5072* (2013.01)
(58) Field of Classification Search
CPC ................................... G06F 17/5072
USPC .......................................... 716/122
See application file for complete search history.

(56) References Cited

U.S. PATENT DOCUMENTS

| 4,495,559 | A | 1/1985 | Gelatt, Jr. et al. |
| 6,035,333 | A | 3/2000 | Jeffries et al. |
| 6,925,061 | B2 | 8/2005 | Lee et al. |
| 6,941,365 | B2 | 9/2005 | Sirgany |

(Continued)

OTHER PUBLICATIONS

Moffitt, et al., "Optimal Rectangle Packing: A Meta-CSP Approach", 2006, pp. 93-102, American Association for Artificial Intelligence, Dept. of Electrical Engineering and Computer Science, University of Michigan, Ann Arbor, US.

(Continued)

*Primary Examiner* — Jack Chiang
*Assistant Examiner* — Brandon Bowers
(74) *Attorney, Agent, or Firm* — Mitch Harris, Atty at Law, LLC; Andrew M. Harris

(57) ABSTRACT

A recursive solution to a bin-packing algorithm provides efficient placement of objects in a physical layout. The algorithm determines requirement vectors for the objects that specify requirement for placement of the object in multiple dimensions, thereby forming a multi-dimensional bin-packing problem. The algorithm assigns the objects to physical partitions or "bins" by recursively exploring partial solutions that place the objects in the partitions by extending the partial solutions via recursion until the objects are placed. The bin-packing algorithm tests requirements vectors for remaining unassigned ones of the objects for both assignment and non-assignment to a current partition in a current partial solution until the current partial solution becomes a complete solution that satisfies the requirement vectors for the plurality of objects.

7 Claims, 9 Drawing Sheets

(56) References Cited

U.S. PATENT DOCUMENTS

| | | | |
|---|---|---|---|
| 7,243,167 B2* | 7/2007 | Zimmer et al. | 710/10 |
| 7,725,900 B2 | 5/2010 | Sauermann | |
| 8,041,611 B2 | 10/2011 | Kleinrock et al. | |
| 8,255,516 B1 | 8/2012 | Zhang et al. | |
| 2002/0016785 A1 | 2/2002 | Sirgany | |
| 2011/0173327 A1 | 7/2011 | Chen et al. | |
| 2013/0042071 A1 | 2/2013 | Chetlur et al. | |
| 2013/0173808 A1 | 7/2013 | Yoon et al. | |

OTHER PUBLICATIONS

Kell, et al., "An MDD Approach to Multidimensional Bin Packing", Proceedings of the 10th International Conference on the Integration of AI and OR Techniques in Constraint Programming for Combinatorial Optimization Problems, 2013, 16 pages (pp. 1-16 in pdf), Carnegie Mellon University, US.
Korf, "A New Algorithm for Optimal Bin Packing", Proceedings of the 18th National Conference on Artificial Intelligence (AAAI 2002), 2002, pp. 731-736, US.
U.S. Appl. No. 14/099,021, Dec. 6, 2013, Moffitt.
U.S. Appl. No. 14/098,960, Dec. 6, 2013, Moffitt.
Shaw, "A Constraint for Bin Packing", Proceedings of the 10th International Conference on Principles and Practice of Constraint Programming (CP 2004), 2004, pp. 648-662, Springer-Verlag Berlin Heidelberg, France.
Castineiras, et al., "Weibull-based Benchmarks for Bin Packing", Proceedings of the 18th International Conference on Principles and Practice of Constraint Programming (CP 2012), 2012, pp. 207-222, Springer-Verlag Berlin Heidelberg.
Kou, et al., "Multidimensional Bin Packing Algorithms", IBM Journal of Research and Development 21(5), Sep. 1977, pp. 443-448, US.
Lodi, et al., "Two-dimensional packing problems: A survey", European Journal of Operational Research 141(2), 2002, pp. 241-252, Elsevier Science B.V.
Lodi, et al., "Heuristic algorithms for the three-dimensional bin packing problem", European Journal of Operational Research 141(2), 2002, pp. 410-420, Elsevier Science B.V.
Chekuri, et al., "On Multi-dimensional Packing Problems", SIAM Journal on Computing, vol. 33, Issue 4, 2004, pp. 1-21, US.
Martello, et al., "Lower Bounds and Reduction Procedures for the Bin Packing Problem", Discrete Applied Mathematics 28, 1990, pp. 59-70, Elsevier Science Publishers B.V., North Holland.
Hoda, et al., "A Systematic Approach to MDD-Based Constraint Programming", Proceedings of the 16th International Conference on Principles and Practice of Constraint Programming (CP 2010), 2010, pp. 266-280, Springer-Verlag Berlin Heidelberg, Carnegie Mellon University, US.
Bergman, et al., "Manipulating MDD Relaxations for Combinatorial Optimization", Proceedings of the 8th International Conference on the Integration of AI and OR Techniques in Constraint Programming for Combinatorial Optimization Problems (CPAIOR 2011), 2011, pp. 20-35, Springer-Verlag Berlin Heidelberg, Carnegie Mellon University, US.
Gent, et al., "From Approximate to Optimal Solutions: Constructing Pruning and Propagation Rules", Proceedings of the 15th International Joint Conference on Artificial Intelligence (IJCAI 1997), 1997, pp. 1396-1401, Scotland.
Korf, "An Improved Algorithm for Optimal Bin Packing", Proceedings of the 18th International Joint Conference on Artificial Intelligence (IJCAI 2003), 2003, pp. 1252-1258, US.
Kitching, et al., "Set Branching in Constraint Optimization", Proceedings of the $21^{st}$ International Joint Conference on Artificial Intelligence (IJCAI 2009), 2009, pp. 532-537, Canada.
Dechter, et al., "Temporal constraint networks", Artificial Intelligence 49, 1991, pp. 61-95, Elsevier Science Publishers B.V., US.
Heinz, et al., "Solving steel mill slab design problems", ZIB-Report 11-38, Sep. 2011, 20 pages. (pp. 1-20 in pdf), Konrad-Zuse-Zentrum für Informationstechnik, Berlin, Germany.
Gargani, et al., "An Efficient Model and Strategy for the Steel Mill Slab Design Problem", Springer-Verlag Berlin Heidelberg (CP 2007), 2007, pp. 77-89, France.
Bansal, et al., "Improved approximation algorithms for multidimensional bin packing problems", Proceedings of the $47^{th}$ Annual IEEE Symposium on Foundations of Computer Science (FOCS'06), Oct. 2006, 10 pages. (pp. 1-10 in pdf), US.
Fukunaga, et al., "Bin-Completion Algorithms for Multicontainer Packing and Covering Problems", Journal of Artificial Intelligence Research, 2007, 8 pages. (pp. 1-8 in pdf), vol. 28, AI Access Foundation, El Segundo, CA, US.
Korf, "Multi-Way Number Partitioning", $21^{st}$ International Joint Conference on Artificial Intelligence (IJCAI-09), Jul. 2009, pp. 538-543, Pasadena, CA, US.
Cazenave, "Nested Monte-Carlo Search", Proceedings of the $21^{st}$ International Joint Conference on Artificial Intelligence (IJCAI-09), Jul. 2009, pp. 456-461, Pasadena, CA, US.
Korf, "A Hybrid Recursive Multi-Way Number Partitioning Algorithm", Proceedings of the $22^{nd}$ International Joint Conference on Artificial Intelligence, 2011, pp. 591-596, AAAI Press, US.

* cited by examiner

MULTI-DIMENSIONAL PHYSICAL ARRANGEMENT TECHNIQUES USING BIN-PACKING WITH PER-BRANCH COMBINATION TRIES

The present Application is a Continuation of U.S. patent application Ser. No. 14/099,021, filed on Dec. 6, 2013 and claims priority thereto under 35 U.S.C. §120. The disclosure of the above-referenced parent U.S. Patent Application is incorporated herein by reference.

BACKGROUND OF THE INVENTION

1. Field of the Invention

The present invention is related to processing systems and networks, and more specifically to techniques for physical layout arrangement using a multi-dimensional bin-packing algorithm that tries combinations of remaining layout resources at each branch.

2. Description of Related Art

Software to solve multi-dimensional layout problems is used in layout of integrated circuit (IC) substrates and printed circuit boards (PCBs), as well as other physical space arrangements such as factory and server equipment layouts and warehouse/shipping storage applications.

A class of algorithms known as bin-packing algorithms can be used to determine efficient arrangement of objects, which correspond to circuit tracks, physical items, etc. within "bins", which correspond to available layout partitions, e.g., circuit routing tracks, that can be used to complete an arrangement. Of particular interest are multi-dimensional bin-packing algorithms, since the mapping of objects to bins in the above problems is not a one-dimensional problem, since circuit width, via locations, availability of ground planes, distance from other tracks and other considerations for PCB or IC substrate layout may be orthogonal requirements, and for the warehousing/shipping case, the bin-packing algorithm may be a direct mapping to the multi-dimensional bin-packing problem.

While multi-dimensional bin-packing algorithms exist that can solve such problems, it is desirable to provide a method for arranging physical layouts that can efficiently perform such allocation without undue waste of resources.

BRIEF SUMMARY OF THE INVENTION

The invention is embodied in a method that arranges physical objects in the partitions of a layout using a multi-dimensional bin-packing algorithm. The method is a computer-performed method of arranging the physical objects in the layout.

The layout arrangement program first determines requirement vectors corresponding to a plurality of physical objects to be placed in the partitions, e.g., circuit traces in a PCB layout, cartons in a warehouse or shipping container, etc. The requirements vectors contain values specifying multiple dimensions for the objects, some of which are physical dimensions, but others of which may be other attributes that govern whether the objects can be placed in a partition. The multi-dimensional bin-packing algorithm assigns the objects to corresponding partitions in the layout by recursively exploring partial solutions for assigning the objects to individual ones of the partitions in order to satisfy the requirement vectors for the plurality of objects. The recursion extends the partial solutions until the requirements in the requirement vectors are met by placement of the objects in partitions having sufficient space/attributes of the multiple types to meet the values specified in the resource requirement vectors. The bin-packing algorithm tests requirements vectors for remaining unassigned ones of the objects for both assignment and non-assignment to a current individual partition in a current partial solution until the current partial solution becomes a complete solution that satisfies the requirement vectors for the plurality of objects.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

Figure 1:
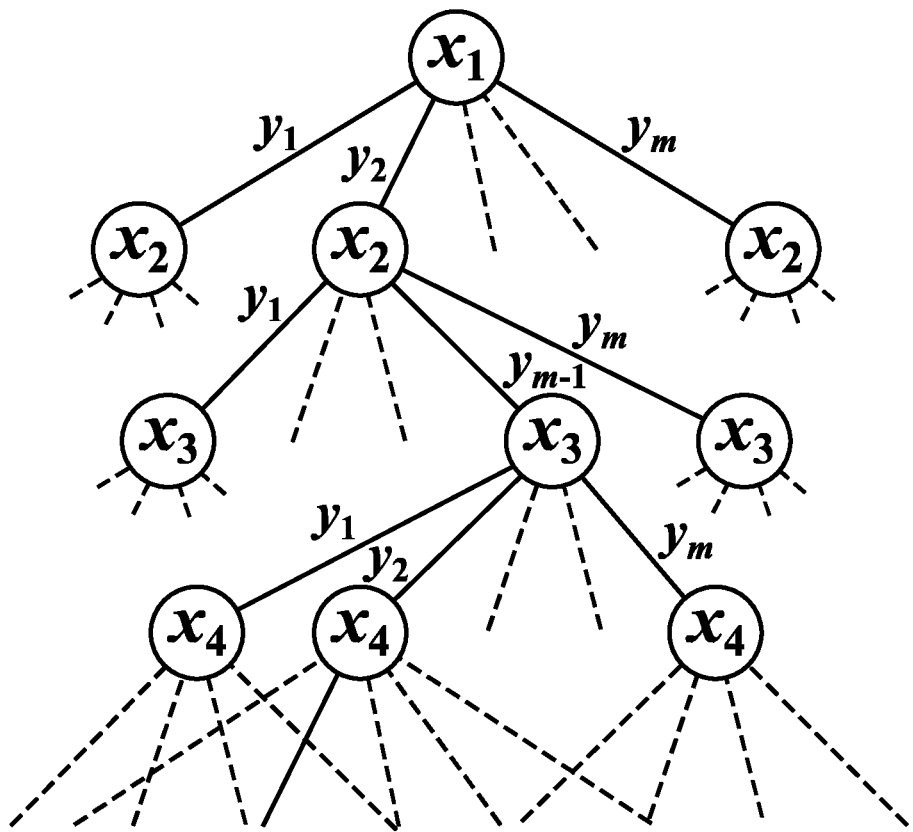
FIG. 1 is a diagram depicting a typical constraint satisfaction problem solution search.

The present invention relates to methods that arrange objects in partitions of a physical layout. A recursive bin-packing algorithm provides efficient placement of objects within the partitions by solving a multi-dimensional bin-packing problem in which requirements vectors specify dimensions for the objects in the multi-dimensions, which may be spatial dimensions and/or other attributes. The bin-packing algorithm recursively explores partial solutions that place the objects in the partitions by extending the partial solutions via recursion until the requirements in the requirement vectors are met. The bin-packing algorithm tests requirements for remaining unplaced objects for both assignment and non-assignment to a current partition in a current partial solution until the current partial solution becomes a complete solution that satisfies the requirement vectors for the plurality of objects, i.e., all of the objects are placed.

The problem of arranging objects in physical layouts can be viewed as a multi-dimensional bin-packing problem.

Since the requirements for placing physical containers or items such as PCB signal paths are generally multi-dimensional, fitting the objects in the available partitions can be modeled as filling physical multi-dimensional bins with objects having multi-dimensional properties, where the layout partitions are modeled as the bins. Both the bins and the objects have fixed dimensions, so the problem is a combinatorial problem of fitting the objects within the bins. The dimensions are similarly fixed for the partitions in which the objects are being placed, and the objects are assumed to have requirements. Examples of such objects are given below in Table I, in which the rows correspond to type of attributes (corresponding to dimensions) that might be required for placement of an object in partitions (correspond to bins), but the possible object types or dimensions are not limited to those that are shown.

TABLE I

| Type | Object dimension 1 | Object dimension 2 | Object dimension 3 | Object dimension 4 |
|---|---|---|---|---|
| PCB track | width | over ground plane [True, False] | distance from adjacent track | distance from noisy signal |
| Shipping/ Warehouse container | width | length | height | temperature range |

Existing solutions to the bin-packing problem in multiple dimensions are either brute-force combinatorial trial-and-error approaches, or more sophisticated algorithms such as heuristic-driven Constraint satisfaction problem (CSP) based search algorithms. In order to understand and implement the bin-packing techniques disclosed herein, a mathematical construct of the problem can be used, which specifies a set of n object sizes $(s_1, \ldots, s_n)$ and a set of m bin capacities $(c_1, \ldots, c_m)$. Each object size $s_i$ is a d-tuple of nonnegative integers $(s_{i,1}, \ldots, s_{i,d})$, and likewise for each bin capacity $c_j = c_{j,1}, \ldots, c_{j,d})$. The objective of the algorithm is to produce an assignment S such that each of the n objects is assigned to exactly one of the m bins without exceeding the capacity of any bin/dimension pair:

$$\sum_{S(i)=j} s_{i,k} \leq c_{j,k} \ \forall \ j \in [1, m], k \in [1, d]$$

Since a complete set of bins is specified in advance, the above formulation is a strict decision problem, as opposed to the optimization variant that is more commonly studied in bin-packing literature.

Recent development in multidimensional bin-packing algorithms transform multidimensional bin-packing into a CSP in which where a variable $x_i$ is created for each object for which a domain $D_i = \{y_1, \ldots, y_m\}$ corresponds to the set of available bins. The CSP has m×d constraints over the subsets that compose each bin. As a definition, a partial assignment P in the CSP formulation of multidimensional bin-packing is a mapping $(x_1, \ldots, x_p) \rightarrow (y_{P(1)}, \ldots, y_{P(p)})$ of a subset of objects to their respective bins such that $\Sigma_{P(x_i)=y_j} s_{i,k} \leq C_{j,k}$ for all $j \in [1, m]$ and $k \in [1, d]$. A complete assignment is any P where $|P|=n$. CSPs are traditionally solved in a depth-first search manner, as illustrated in the diagram of FIG. 1, in which variables are selected sequentially and each value leads to a separate branch of search. The search state is encoded implicitly in the call stack, with each recursive call forming a node along a partial path. For the CSP formulation of multidimensional bin-packing, a different approach has been taken, in which the various combinations of object-bin assignments are stored explicitly in a so-called multi-valued decision diagram (MDD). In a CSP with n variables, the MDD has n+1 layers that may be denoted $L_1, \ldots, L_{n+1}$. Each layer contains a set of nodes, and each edge connects nodes in adjacent layers $L_i$ and $L_{i+1}$ reflecting an assignment to the variable $x_i$. The final layer $L_{n+1}$ has a single node (referred to as "the sink") representing a complete solution result. Any path in the MDD from root to sink corresponds to a solution to the CSP. The values of the solution are specified by the labels of the connections along the path. Partial paths correspond to partial solutions that may or may not extend to complete solutions.

Figure 2A:
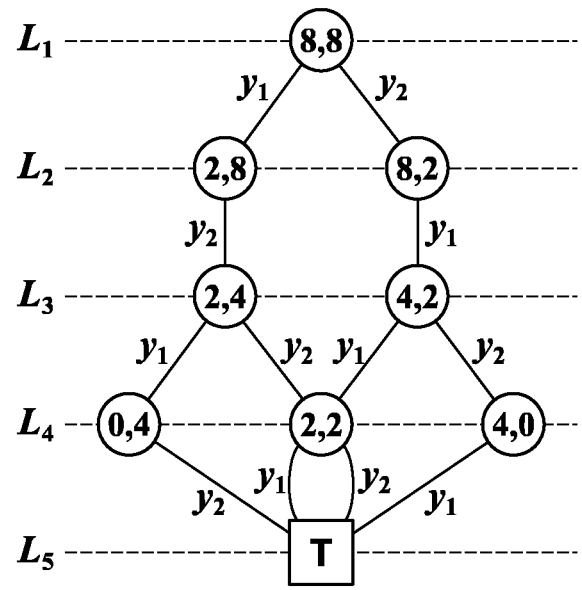
FIGS. 2A-2B are multi-valued decision diagrams depicting direct and ullage solution searches.
Figure 2B:
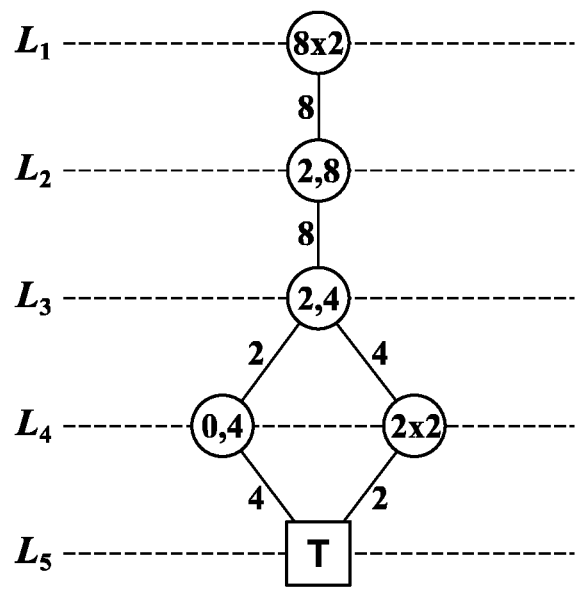

In a direct MDD representation, as exemplified in FIG. 2A, the nodes in each layer are labeled with states that map each bin to its remaining multidimensional capacities (referred to as the "ullage" vector). Connections are labeled with the index of the bin $y_j$ corresponding to the corresponding assignment for $x_i$. The ullage vectors of two nodes u and v at respective layers $L_i$ and $L_{i+1}$ that are joined by a connection $y_j$ differ only at position j (i.e., $v_j = u_j - s_i$). If two nodes at the same layer were to share identical ullage vectors across all bins, the set of feasible completions beneath the two nodes would be identical. To prevent the construction and expansion of duplicate structures, the MDD stores only one copy of each node at a layer, effectively merging the paths of isomorphic partial assignments. The merging not only reduces the MDD's overall size, but also reduces the effort required to find a complete path from root to sink. In FIG. 2A, node (2, 2) at layer $L_4$ reflects a merger of two partial assignments: the extension of (2, 4) at layer $L_3$ with $x_3 \leftarrow y_2$, and the extension of (4, 2) at layer $L_3$ with $x_3 \leftarrow y_1$. FIG. 2B illustrates an alternative ullage solution search that collapses nodes with identical ullage multiplicities.

Figure 3:
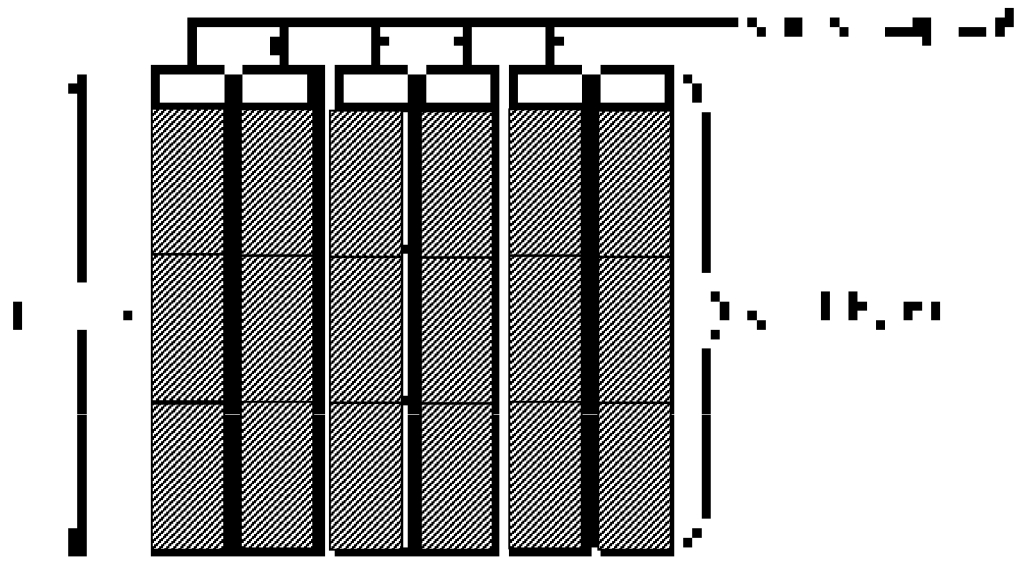
FIG. 3 is a bin diagram illustrating a bin-packing problem as can be solved by embodiments of the present invention.

A fundamental challenge that arises in any practical implementation of multidimensional bin-packing is the computation of strong lower bounds, i.e., estimating the minimum number of additional bins ultimately needed to extend a partial assignment. Even in a decision variant of the problem where precisely m bins are available, such bounding is critical in determining wasted space and pruning nodes for which any complete extension is incapable of remaining within the available resource envelope. For example, consider a d-dimensional bin-packing instance having m bins and n=pm+2 objects for some $p \geq 1$. For all $1 \leq i \leq n-2$ and $1 \leq k \leq d$, $s_{i,k}$ is set to m. For the final two objects ($s_{n-1}$ and $s_n$), the sizes across all dimensions are set to m−1 and 1 respectively. Bin capacities $c_{j,k}$ are set to pm+1 for all $1 \leq j \leq m$ and $1 \leq k \leq d$. By construction, the combined capacity for the above example appears sufficient to accommodate all objects. For any dimension k, the quantity $\Sigma_j c_{j,k}$ is equal to $m(pm+1) = pm^2 + m$, which is equivalent to the combined demand across all pm+2 objects. However, each bin can accommodate at most p objects of size m if m>1, requiring at least one unit of empty space in all but a single bin. The above example is clearly contrived to be infeasible. FIG. 3 illustrates a case in which m=6 and p=3. In any partial assignment, only 19 of the 20 objects can be packed into the bins without overflow.

In a conventional approach to a multi-dimensional CSP using direct combinatorial search, that is, an approach in which branching takes place on the assignment of individual objects, effective lower bounds can be difficult to compute. Only at leaf nodes in the search are all objects bound to individual bins. Until all objects are assigned to bins, the provable amount of wasted space for any single bin is typically unknown. In the examples given above, the number of partial assignments that successfully place all but the last two objects is:

$$\binom{pm}{p} \times \binom{p(m-1)}{p} \times \binom{p(m-2)}{p} \times \ldots \times 1$$

To address pathological cases such as the above example, slightly improved inference rules can be adopted, but the modified rules typically depend heavily on structural properties of the instance. For example, if it were not for a unit-sized object $s_n$ in the example, modulo arithmetic could quickly detect that the maximum capacity utilized by any bin is at most pm.

To overcome the above-mentioned constraints, in the instant disclosure, a different approach is taken to solving the multidimensional bin-packing CSP. In contrast to traditional approaches that branch on the assignment of individual objects, the technique disclosed herein instantiates the contents of bins sequentially and independently based on the concept of set branching in a meta-CSP. The exemplary algorithm remains depth-first, but adopts a least commitment strategy for individual objects when the exclusion of the object from a bin is considered. The use of MDDs can be abandoned in favor of using aggregate capacity over incomplete bins to establish bounds on the solution quality of a partial assignment. The exemplary model exploits a type of set branching modeling in a meta-CSP, in which the variables correspond to bin contents, and the values correspond to complete subsets of objects. As a definition, a partial assignment P in the meta-CSP formulation of multidimensional bin-packing is a list of object subsets $(S_1, \ldots, S_p)$ such that $\Sigma_{x_i \in S(j)} s_{i,k} \geq c_{j,k}$ for all $j \in [1, p]$ and $k \in [1, d]$, and $P_j \cap P_{j'} = \emptyset$ for any $j \neq j'$. A complete assignment is any such P where $|P|=m$ and $UP_j = \{x_1, \ldots, x_n\}$. In contrast to the original CSPs described above, in which the complete contents of each bin are subject to change for each of the branches, the meta-CSP commits to specific complete subsets of object assignments as each branch is explored.

In a multidimensional bin-packing problem with n objects, the number of potential subsets of objects to assign to any bin is $2^n$. It may be possible to explicitly enumerate all such subsets in advance if n is relatively small, but such an exhaustive process is clearly intractable for significantly large n. Furthermore, most possible subsets will not be feasible candidates for a given subset $S_j$, due either to the bounds imposed by the multidimensional capacity constraints $c_{j,k}$ or by the inclusion of objects in previously instantiated subsets $S_1$ to $S_{j-1}$. Therefore, in the instant example potential values are dynamically generated by nested recursion. As the bin-packing problem search descends to compute alternative branches for the next meta-variable $S_j$, a list of as-yet unassigned objects U is passed from the parent node. All partial combinations of objects in U are tested for feasibility by incrementally subtracting the demand of each object from an available capacity vector that begins at $\{c_{j,1}, \ldots, c_{j,d}\}$. Subsets are pruned whenever the capacity along any dimension becomes negative, ensuring that only a fraction of the full $2^{|U|}$ subsets is considered. By comparison, the order in which partial assignments are expanded in the exemplary meta-CSP and a typical CSP solution differs significantly. In a typical CSP solution, once an object $x_i$ is excluded from subset $S_j$, the object is immediately committed to inclusion in some other specific subset $S_{j'}$. In contrast, the meta-CSP or the exemplary embodiment effectively defers the ultimate assignment of $x_i$, taking a least commitment approach and instead selects some replacement $x_{i'}$ for inclusion in $S_j$. As will be shown below, the least-commitment strategy allows substantial inference to be performed on partial assignments.

Figure 4:
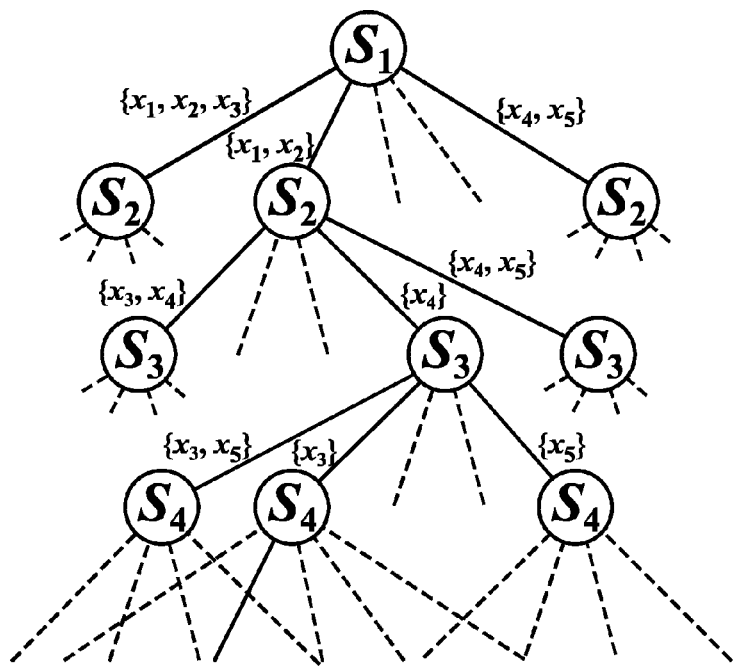
FIG. 4 is a diagram depicting a constraint satisfaction problem solution search as performed by techniques according to an embodiment of the invention.

The nodes explored by searching the meta-CSP described above are shown in FIG. 4 and roughly correspond to the same nodes expanded by those explored in the CSP formulation illustrated in FIG. 1 (albeit in a different order). In both solutions, combinations of objects to bins are considered exhaustively with basic pruning rules serving to prohibit bin overflow along any partial path. However, each partial assignment $P=(S_1, \ldots, S_p)$ in the meta-CSP of FIG. 4 corresponds to a set of complete subsets, since the exemplary meta-CSP search procedure is prohibited from retroactively inserting objects into previously assigned bins. The exemplary meta-CSP requires that all remaining objects must be distributed across only the remaining (un-instantiated) meta-variables $\{S_{p+1}, \ldots, S_m\}$. The above rule can be leveraged to strengthen the inference performed at intermediate nodes of the solution. The observation can be expressed as a theorem. Consider a partial assignment $P=(S_1, \ldots, S_p)$ that leaves $U=\{x_i, \ldots, x_n\}-UP_j$ objects unassigned. For any complete assignment $P'$ that descends from P, it must be the case that $\Sigma_{x_i \in U} s_{i,k} \leq \Sigma_{j \in [p+1,m]} c_{j,k}$ for all $k \in [1, d]$. The proof of the above-stated theorem is straightforward. If there exists any dimension for which the total amount of remaining demand exceeds the total amount of remaining capacity, no feasible assignment of objects to bins can be achieved that is capable of respecting all capacity constraints. The above rule can be used as the basis for a stronger pruning criterion that aggregates capacities of un-instantiated bins.

By pruning intermediate nodes that violate capacity constraints for any bin, the exemplary bin-packing algorithm avoids pursuing partial solution in which bin contents are strictly oversubscribed. However, the potential still remains for a bin to be assigned too few elements, causing a waste of available resources. For example, in the trace shown in FIG. 4, after the assignment $S_1 \leftarrow \{x_1, x_2, x_3\}$, a (weaker) assignment $S_1 \leftarrow \{x_1, x_2\}$ is subsequently attempted. The latter partial assignment is clearly dominated by the former. While such a partial solution it may indeed lead to a feasible complete solution. Any such complete solution would have been found by exploring extensions to the assignment for which $S_1$ also included $x_3$. Thus, the exemplary meta-CSP algorithm avoids expanding any search node for which there exists a bin with sufficient capacity to accommodate objects for which assignment has been deferred. The exemplary meta-CSP algorithm allows symmetry to be exploited by forcing one specific unassigned object into a bin currently under consideration. For example, at the topmost level in search in FIG. 4, the inclusion of object $x_1$ in $S_1$ can be imposed upon all partial assignments, pruning cases such as $S_1 \leftarrow \{x_4, x_5\}$ for which all extensions are isomorphic to assignments previously considered in the search.

In an example pseudo-code listing, the complete exemplary bin-packing algorithm is presented. The recursive function Solve(j, U, $S_j$, $IS_j$) provides the solution and accepts j as the index of the bin whose contents are being considered, U as the remaining objects to assign, $S_j$ as the set of objects to be included in bin j, and IS, as the set of objects to be excluded from bin j. The pseudo-code example returns UNSAT for an incomplete (unsatisfied) solution, and SAT for a complete solution that satisfies the bin-packing problem.

Solve (j, U, $S_j$, $IS_j$)
begin
// check $S_j$ for assigned object having a dimension too large for the current bin for all objects i in $S_j$:
    if there is a k for which $s_{i,k} > c_{j,k}$ then return UNSAT -continued

```
// search |S_j for object that is too large in a dimension for any remaining
bin for all objects i in |S_j:
    for all j' > j:
        if there is a k for which s_{i,k} > c_{j',k} then return UNSAT
// If there are no objects left to assign
if U = Ø then
    // if all objects have been assigned - success!
    if j = m then return SAT
    // otherwise check this partial solution to see if a dominant solution
    has been
    // found previously
    for each object i in |S_j
        if there is an i' for which s_{i',k} = c_{j,k} with object i included in S_j
        then return UNSAT
    // recurse to finish current partial solution
    return Solve (j+1, |S_j, Ø, Ø)
// otherwise select a remaining object
i ← Select(U)
// explore solution branch for inclusion of this object
if Solve (j, U - {i}, S_j ∪ {i}, |S_j) then return SAT
// check if the current partial solution exists at all
if S_j != Ø
    // explore solution branch for exclusion of this object
    if Solve (j, U - {i}, S_j, |S_j ∪ {i}) then return SAT
return UNSAT
end
```

Figure 5A:
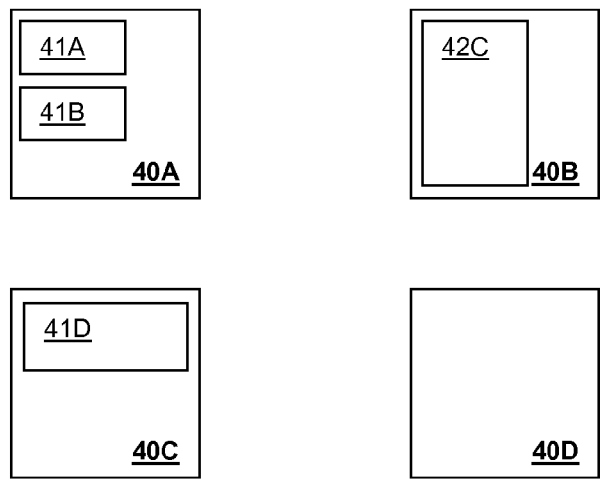
FIGS. 5A-5B are pictorial diagrams depicting layouts of various physical objects in partitions that may be performed by embodiments of the present invention.
Figure 5B:
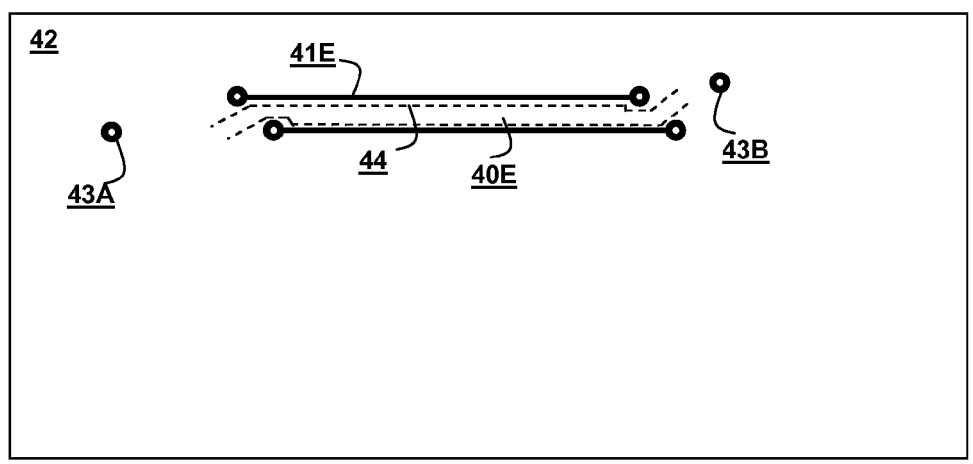

The above algorithm is applied to the layout of physical items within partitions of a model of a physical layout, as illustrated in FIG. 5A and FIG. 5B. A plurality of bins or partitions 40A-40D are shown in FIG. 5A, which may be, for example, storage containers or warehouse space. Objects 41A-41D are placed within bins 40A-40D. Requirements vectors are generated for each of the objects 41A-41D, which serve as object sizes ($s_1, \ldots, s_n$) in the above algorithm and a set of m bin capacities ($c_1, \ldots, c_m$) are generated from partitions 40A-40D. Not all of the sizes are necessarily physical dimensions of objects 41A-41D, nor are the values necessarily continuous. For example, a storage container may have a binary or n-valued specification for the quality or climate of storage, etc. FIG. 5B shows a PCB or IC substrate layout in which the objects are, for example, signal paths 41E and the partitions are, for example, circuit track areas 40E, in which signal paths 41E may be routed. For example, a signal path may be needed between via 43A and via 43B and tested for routing through circuit track area 40E which is bounded by perimeter 44. As mentioned above, characteristics such as ground plane proximity or proximity to other signal paths may form "sizes" within the requirements vector for the prospective signal path route.

Figure 6:
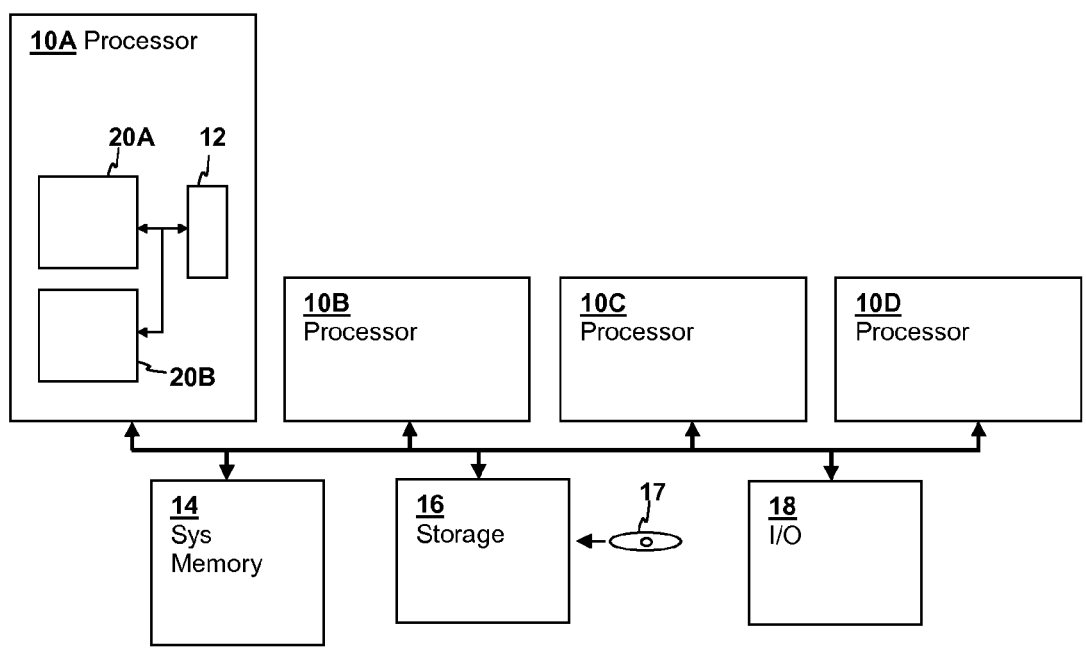
FIG. 6 is a block diagram of a computer system in which methods in accordance with embodiments of the present invention can be implemented by program instructions.

Referring now to FIG. 6, a processing system is shown in which program instructions implementing the above algorithm in accordance with an embodiment of the present invention are executed, and which may also serve as an example of one of the groups of computing or communications resources 40A-40D in the form of a multi-processing system with certain available resources. The exemplary processing system includes a number of processors 10A-10D. The depicted multi-processing system is illustrative, and a processing system in accordance with other embodiments of the present invention include uni-processor systems or any device capable of executing the above algorithm and the controlling the placement of objects 41A-41E within partitions 40A-40E. Processors 10A-10D are identical in structure and include cores 20A-20B and a local storage 12, which may be a cache level, or a level of internal system memory. Processors 10A-10D are coupled to main system memory 14, a storage subsystem 16, which includes non-removable drives and optical drives, for reading media such as a CD-ROM 17 forming a computer program product and containing program instructions implementing a layout arrangement program for execution by processors 10A-10D, and also containing executable programs that implement applications and services executing within the computer system. The illustrated processing system also includes input/output (I/O) interfaces and devices 18 such as mice and keyboards for receiving user input and graphical displays for displaying information. While the system of FIG. 6 is used to provide an illustration of a system in which the processor architecture of the present invention is implemented, it is understood that the depicted architecture is not limiting and is intended to provide an example of a suitable computer system in which the techniques of the present invention are applied.

Figure 7:
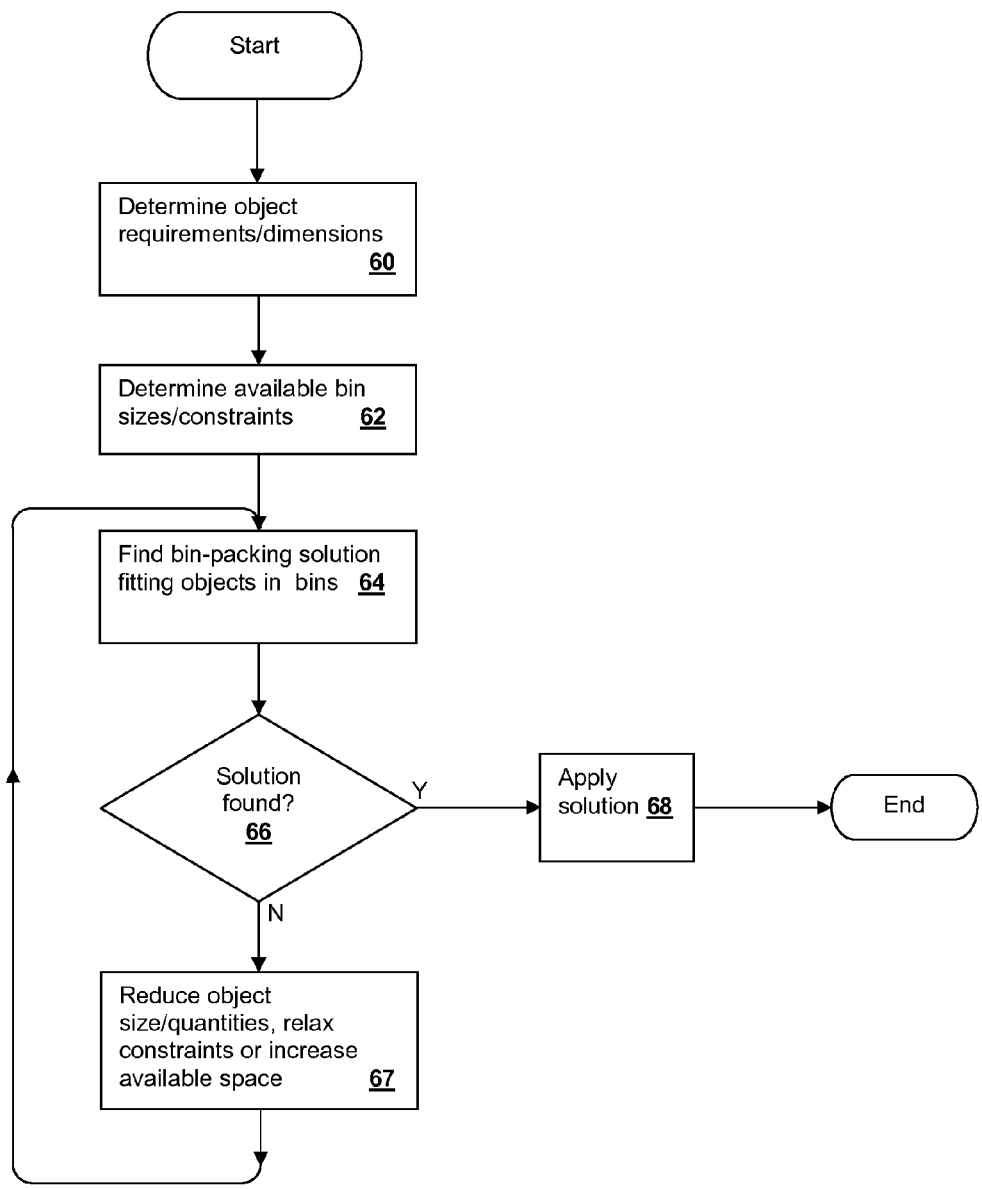
FIG. 7 is a flowchart depicting a method of physical layout of objects in partitions in accordance with an embodiment of the present invention.

Referring now to FIG. 7, an object placement method in accordance with an embodiment of the invention is illustrated. The space/attributes needed for each object is determined (step 60) and the physical partition dimensions/attributes available in the layout are also determined (step 62). A bin-packing solution fitting the objects to the layout is searched (step 64) and if a solution is found (decision 66), the solution is applied (step 68). Otherwise, quantity of objects and/or the requirements for the objects are decreased, or the available space is increased (step 67) and the steps from 64-67 are repeated.

Figure 8A:
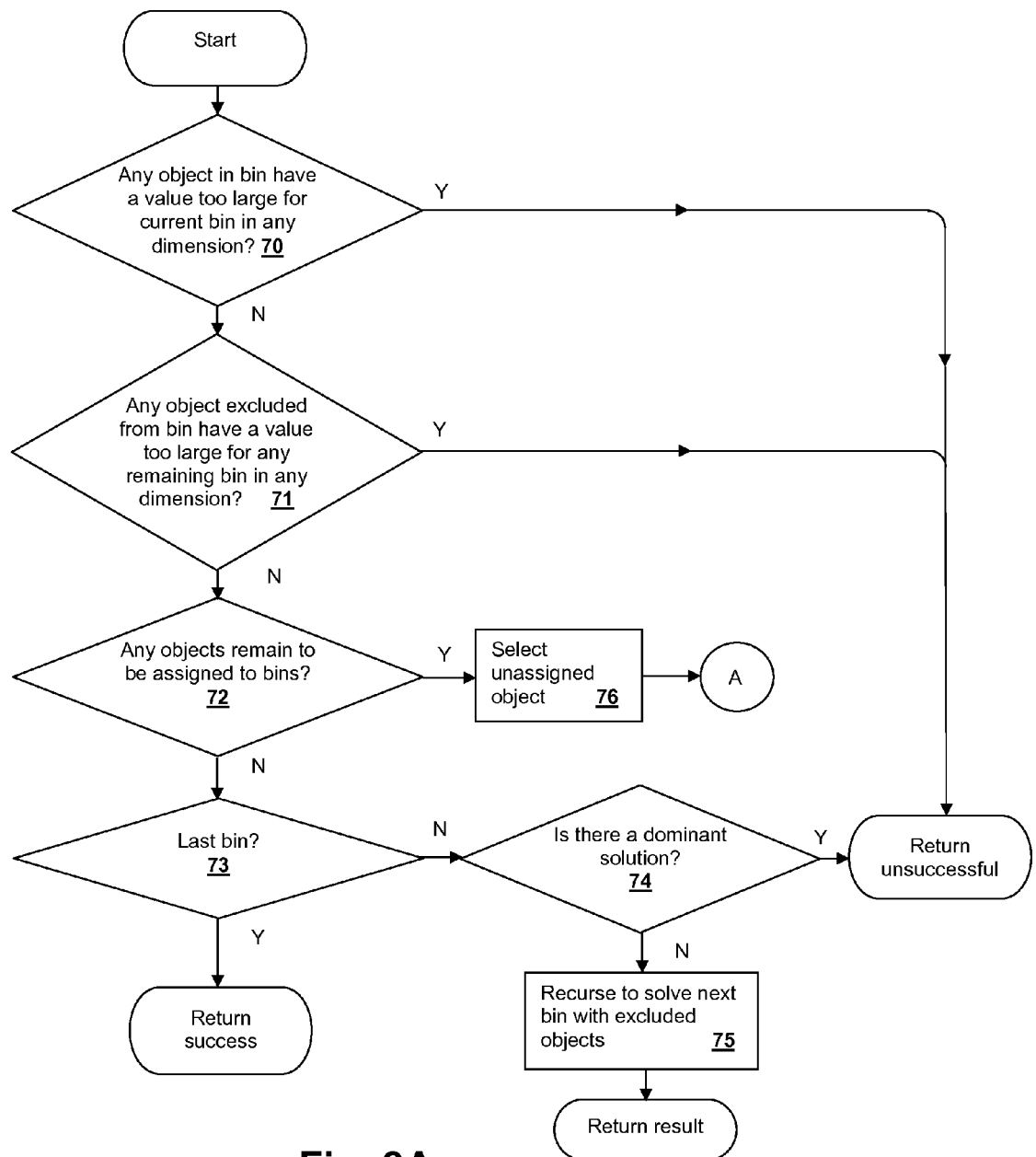
FIG. 8A-8B form a flowchart depicting a method of solving the bin-packing algorithm as may be implemented in the method depicted in FIG. 7.
Figure 8B:
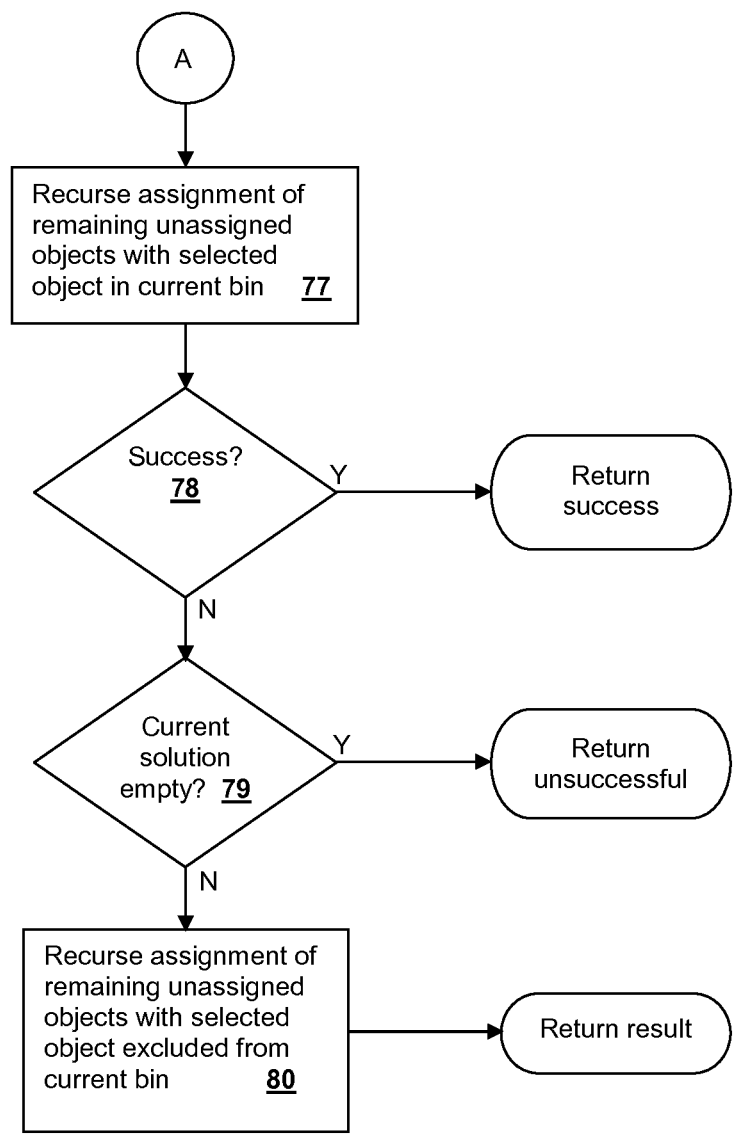

Referring now to FIGS. 8A-8B, the above-described bin-packing algorithm is shown in a flowchart. First, for the current partial solution $S_j$, if an object in the current bin has a value too large for the bin in any dimension (decision 70), the bin-packing algorithm returns unsuccessfully. Next if any object is excluded from the current bin that has a value too large for any remaining bin in any dimension (decision 71), the bin-packing algorithm returns unsuccessfully. If no objects remain to be assigned to the bins (decision 72) and the last bin has been reached (decision 73), then the algorithm returns successfully. Otherwise if the last bin has not been reached (decision 73), the current partial solution is checked for a dominant solution (decision 74). If there is a dominant solution, the bin-packing algorithm returns unsuccessfully. Otherwise, the algorithm is called recursively to solve the next bin with the set of objects excluded from the current partial solution (step 75). If objects remain to be assigned to the bins (decision 72), an unassigned object is selected (step 76) and the bin-packing algorithm is called recursively to assign remaining unassigned objects with the selected object in the current bin (step 77). If the recursion succeeds (decision 78) the bin-packing algorithm returns successfully. Otherwise, if the recursion fails (decision 78), and if the current partial solution is empty (decision 79), the bin-packing algorithm returns unsuccessfully. Otherwise, if the current partial solution is non-empty (decision 79), the bin-packing algorithm is called recursively to assign remaining unassigned objects with the selected object excluded from the current bin (step 80).

Figure 9:
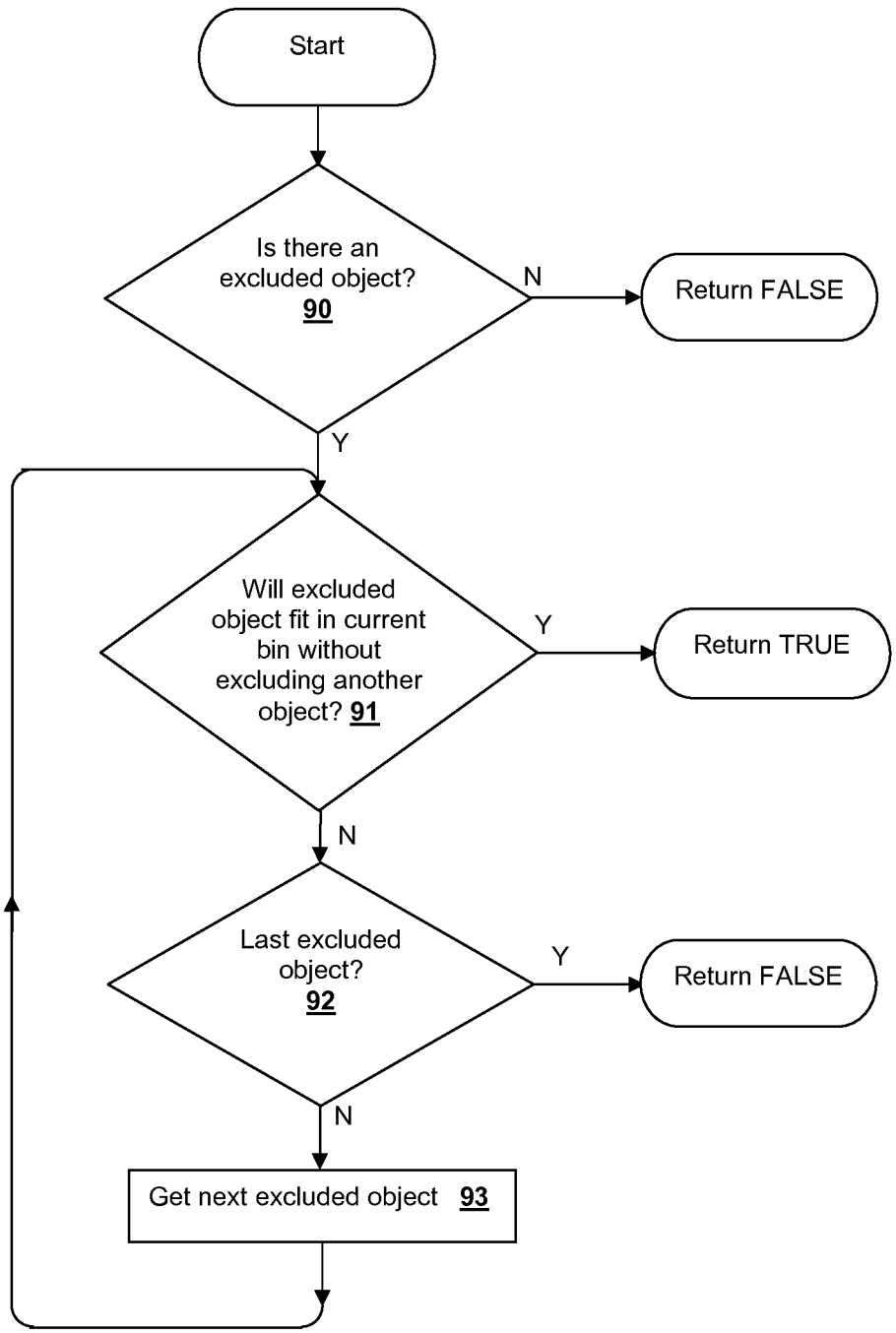
FIG. 9 is a flowchart depicting a method of pruning solutions as may be employed in the method depicted in FIG. 7.

Referring now to FIG. 9, details of the dominant solution check in decision 74 of FIG. 8A is shown. First, the current partial solution is checked to determine if there is an excluded object (decision 90). If there is not an excluded object (decision 90), the dominant solution check returns false. If there is an excluded object (decision 90), a check is performed to determine if the excluded object can be included in the current bin without excluding another object (decision 91). Until the last excluded object has been processed (decision 92), the algorithm performs steps 91-92 with the next excluded object (step 93).

As noted above, portions of the present invention may be embodied in a computer program product, which may include firmware, an image in system memory or another memory/cache, or stored on a fixed or re-writable media such as an optical disc having computer-readable code stored thereon. Any combination of one or more computer readable medium(s) may store a program in accordance with an embodiment of the invention. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

In the context of the present application, a computer readable storage medium may be any tangible medium that can contain, or store a program for use by or in connection with an instruction execution system, apparatus, or device. A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A computer-performed method of placing objects in partitions of a physical layout, the method comprising:
    within a computer system, first determining requirements vectors corresponding to the objects, wherein the requirements vectors contain values specifying requirements of the object in multiple dimensions;
    assigning the objects to the partitions of the physical layout within a model of the physical layout using a bin-packing algorithm executed by the computer system that recursively explores partial solutions for assigning the objects to individual ones of the partitions in order to satisfy the requirements vectors for the objects, wherein the bin-packing algorithm extends the partial solutions via the recursion until the requirements in the requirements vectors are met by assignment of the corresponding object to partitions having sufficient resources in the multiple dimensions to meet the values specified in the requirements vectors, wherein the bin-packing algorithm tests requirements vectors of remaining unassigned ones of objects for both assignment and non-assignment to a current individual partition in a current partial solution until the current partial solution becomes a complete solution that satisfies the requirements vectors for the objects; and
    placing the objects within the physical layout according to the complete solution determined by the assigning.

2. The method of claim 1, wherein the bin-packing algorithm terminates the recursion of partial solutions that do not become the complete solution upon detecting that a partial solution being explored is covered by a dominant solution previously explored.

3. The method of claim 2, wherein the detecting is performed by second determining that a requirements vector for an excluded object can be satisfied by the current individual partition without excluding another object assigned to the current individual partition in the current partial solution.

4. The method of claim 1, wherein the bin-packing algorithm comprises:
    for the current partial solution, second determining if any objects remain to be assigned to the partitions;
    responsive to having determined that objects remain to be assigned to the partitions, selecting an unassigned object;
    with the selected object assigned to the partition corresponding to the current partial solution, first recursively applying the assigning of the objects to assign the remaining objects other than the selected object;
    third determining if the recursively applying generated a complete solution assigning the remaining objects;
    responsive to having determined that the recursively applying did not generate a complete solution, fourth determining if the current partition has an included object; and
    responsive to having determined that the current group has an included object, with the selected object excluded from the current partition, second recursively applying the assigning of the objects to assign the remaining objects other than the selected object.

5. The method of claim 4, further comprising:
    prior to the second determining if any objects remain to be assigned to the partitions, fifth determining if any object placed in the current partition has a requirements vector that cannot be satisfied by the current partition or if any object excluded from the current partition has a requirements vector that cannot be satisfied by a remaining one of the partitions; and
    responsive to having determined that the requirements vector cannot be satisfied by the current partition or if any object excluded from the current partition has a requirements vector that cannot be satisfied by a remaining one of the partitions, not performing the selecting, the first recursively applying and the second recursively applying.

6. The method of claim 1, wherein the partitions are physical layout resources of an electronic device, and wherein the objects are interconnecting conductors of the electronic device, and wherein the placing comprises fabricating the electronic device according to the complete solution.

7. The method of claim 1, wherein the partitions are physical storage locations, and wherein the objects are objects to be stored, and wherein the placing comprises placing the objects within the physical storage locations.

* * * * *